(12) United States Patent
Lee et al.

(10) Patent No.: US 11,791,725 B2
(45) Date of Patent: Oct. 17, 2023

(54) VOLTAGE REGULATOR WITH HYBRID CONTROL FOR FAST TRANSIENT RESPONSE

(71) Applicant: MEDIATEK INC., Hsin-Chu (TW)

(72) Inventors: Chien-Lung Lee, Hsinchu (TW); Jin-Yan Syu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 118 days.

(21) Appl. No.: 17/368,853

(22) Filed: Jul. 7, 2021

(65) Prior Publication Data

US 2022/0045606 A1 Feb. 10, 2022

Related U.S. Application Data

(60) Provisional application No. 63/061,821, filed on Aug. 6, 2020.

(51) Int. Cl.
| | |
|---|---|
| *H02M 3/158* | (2006.01) |
| *G05F 1/575* | (2006.01) |
| *H03F 1/02* | (2006.01) |
| *H02M 1/15* | (2006.01) |
| *H02M 3/156* | (2006.01) |
| *G05F 1/565* | (2006.01) |
| *G05F 1/56* | (2006.01) |

(52) U.S. Cl.
CPC ............ *H02M 3/158* (2013.01); *G05F 1/575* (2013.01); *G05F 1/561* (2013.01); *G05F 1/565* (2013.01); *H02M 1/15* (2013.01); *H02M 3/1566* (2021.05); *H03F 1/0211* (2013.01); *H03F 2200/432* (2013.01)

(58) Field of Classification Search
None
See application file for complete search history.

(56) References Cited

U.S. PATENT DOCUMENTS

| 5,889,392 A | 3/1999 | Moore et al. |
|---|---|---|
| 5,939,867 A | 8/1999 | Capici et al. |
| 6,157,176 A | 12/2000 | Pulvirenti et al. |

(Continued)

FOREIGN PATENT DOCUMENTS

| CN | 1165992 A | 11/1997 |
|---|---|---|
| CN | 108710399 A | 10/2018 |

(Continued)

OTHER PUBLICATIONS

Vahideh Shirmohammadli et al, An Efficient CMOS LDO-Assisted DC/DC Buck Regulator, 2016 IEEE, 2016, pp. 1-4, XP055869706.

(Continued)

*Primary Examiner* — Matthew V Nguyen
(74) *Attorney, Agent, or Firm* — Winston Hsu

(57) ABSTRACT

The present invention provides a voltage regulator including a voltage control circuit and a current control circuit. The voltage control circuit is configured to receive an output voltage of the voltage regulator to generate a first current to an output terminal of the voltage regulator; and the current control circuit is configured to generate a second current to the output terminal of the voltage regulator according to an output current of the voltage regulator, wherein the output current is generated according to the first current and the second current.

10 Claims, 4 Drawing Sheets

(56) References Cited

U.S. PATENT DOCUMENTS

| | | | |
|---|---|---|---|
| 9,377,799 B2* | 6/2016 | Lee | G11C 5/147 |
| 9,405,309 B2 | 8/2016 | Biziitu | |
| 9,473,027 B2 | 10/2016 | Dong | |
| 9,791,874 B1* | 10/2017 | Wang | G05F 1/575 |
| 2011/0101937 A1 | 5/2011 | Dobkin | |
| 2012/0146597 A1 | 6/2012 | Shimizu | |
| 2013/0234687 A1 | 9/2013 | Fujimura | |
| 2016/0282890 A1* | 9/2016 | Malinowski | G05F 1/575 |
| 2022/0334604 A1* | 10/2022 | Kim | G09G 3/3225 |
| 2022/0413531 A1* | 12/2022 | Mammei | G05F 1/565 |
| 2023/0016930 A1* | 1/2023 | Tschirhart | H02M 1/0048 |

FOREIGN PATENT DOCUMENTS

| | | | | |
|---|---|---|---|---|
| CN | 110058631 A | | 7/2019 | |
| CN | 110658878 | * | 1/2020 | G05F 1/56 |
| CN | 111093409 A | | 5/2020 | |
| TW | 201346925 A | | 11/2013 | |
| TW | 201415187 A | | 4/2014 | |
| WO | 2018/153565 A1 | | 8/2018 | |

OTHER PUBLICATIONS

Peter Harrington et al., A low noise, high power efficiency supply regulator for near-field power delivery, Analog Integr Circ Sig Process, Aug. 8, 2010, pp. 177-187, Springer Science+Business Media, LLC 2010, XP019879654, Aug. 8, 2010.

* cited by examiner

VOLTAGE REGULATOR WITH HYBRID CONTROL FOR FAST TRANSIENT RESPONSE

CROSS REFERENCE TO RELATED APPLICATIONS

This application claims the priority of U.S. Provisional Application No. 63/061,821 (filed on Aug. 6, 2020), which is included herein by reference in its entirety.

BACKGROUND

A voltage regulator is a system designed to automatically maintain a constant output voltage. In order to have the constant output voltage, an error amplifier designed in the voltage regulator is configured to compare output voltage with a reference voltage to generate a control signal to charge or discharge an output terminal. However, this control mechanism using the output voltage as a feedback signal has a slower response, that is the voltage regulator will charge or discharge the output terminal only after the voltage is away from the desired level for a period of time.

In order to improve the transient response of the voltage regulator, the voltage regulator may be designed to have higher quiescent current or to have large output capacitor. However, higher quiescent current means higher power consumption; and designing large output capacitor will increase the manufacturing cost.

SUMMARY

It is therefore an objective of the present invention to providing a voltage regulator with hybrid control, which has fast transient response with lower manufacturing cost, to solve the above-mentioned problems.

According to one embodiment of the present invention, a voltage regulator comprising a voltage control circuit and a current control circuit is disclosed. The voltage control circuit is configured to receive an output voltage of the voltage regulator to generate a first current to an output terminal of the voltage regulator; and the current control circuit is configured to generate a second current to the output terminal of the voltage regulator according to an output current of the voltage regulator, wherein the output current is generated according to the first current and the second current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
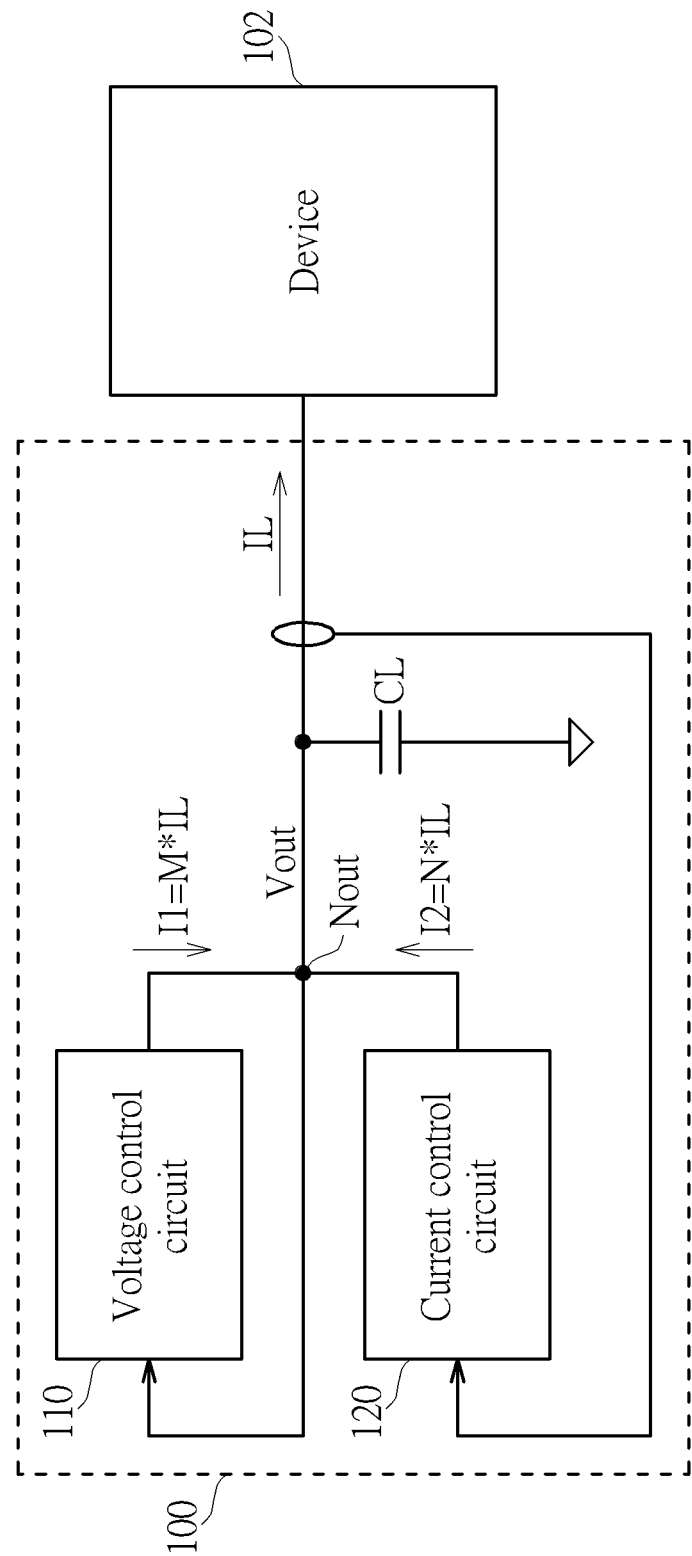
FIG. 1 is a diagram illustrating a voltage regulator according to one embodiment of the present invention.

FIG. 1 is a diagram illustrating a voltage regulator 100 according to one embodiment of the present invention. As shown in FIG. 1, the voltage regulator 100 is coupled to a device 102, the voltage regulator 100 is configured to provide a stable output voltage Vout to the device 102, and the device 102 draws an output current IL from the voltage regulator 100. The voltage regulator 100 comprises a voltage control circuit 110, a current control circuit 120 and an output capacitor CL, wherein the voltage control circuit 110 is configured to provide a first current I1 to an output terminal Nout of the voltage regulator 100, the current control circuit 120 is configured to provide a second current I2 to the output terminal Nout, and the first current I1 and the second current I2 are combined to serve as the output current I1.

In this embodiment, the voltage control circuit 110 is configured to receive the output voltage Vout to generate the first current I1, so that the output voltage Vout maintains a constant voltage. Specifically, if the output voltage Vout drops, the voltage control circuit 110 can determine that the output voltage Vout is lower than a desired level, and the voltage control circuit 110 outputs higher first current I1 to increase the output voltage Vout. If the output voltage Vout is above the desired level, the voltage control circuit 110 outputs lower first current I1 to decrease the output voltage Vout. The current control circuit 120 is configured to receive the output current IL to generate the second current I2, so that the voltage regulator 100 has a faster response when the output voltage Vout is away from the desired level. Specifically, if the device 102 draws more output current IL and the output voltage Vout drops, the current control circuit 110 can immediately provide higher second current I2 to increase the output voltage Vout.

In the embodiment shown in FIG. 1, by designing the current control circuit 120 to use the output current IL to generate the second current I2, the output voltage Vout can be compensated to make the output voltage Vout return to the desired level in a short time. Therefore, the voltage regulator 100 has fast response when the output voltage Vout is away from the desired level. In addition, each of the voltage control circuit 110 and the current control circuit 120 has its own feedback loop, the second current I2 provided by the current control circuit 120 does not exceed the required output current IL, and the voltage control circuit 110 is configured to provide the first current I1 to supplement the insufficient current, so the loops of the voltage control circuit 110 and the current control circuit 120 do not conflict. Furthermore, because the current control circuit 120 provides a portion of the output current IL, the voltage control circuit 110 with lower transient response does not need to provide large current to the output terminal Nout, and the output capacitor CL can be designed smaller, that is the voltage control circuit 110 has easier loop compensation design and the manufacturing cost can be reduced.

In one embodiment, the second current I2 provided by the current control circuit 120 has a fixed proportional relationship with the output current IL, that is I2=N*IL, wherein N can be any suitable value such as 80% or 90%. In addition, because the IL=I1+I2, the first current I1 provided by the voltage control circuit 110 is also has a fixed proportional relationship with the output current IL, that is I1=M*IL, wherein M+N=100%. In one embodiment, in order to have fast transient response, N is greater than M, for example, N is equal to 90% while M is equal to 10%.

Figure 2:
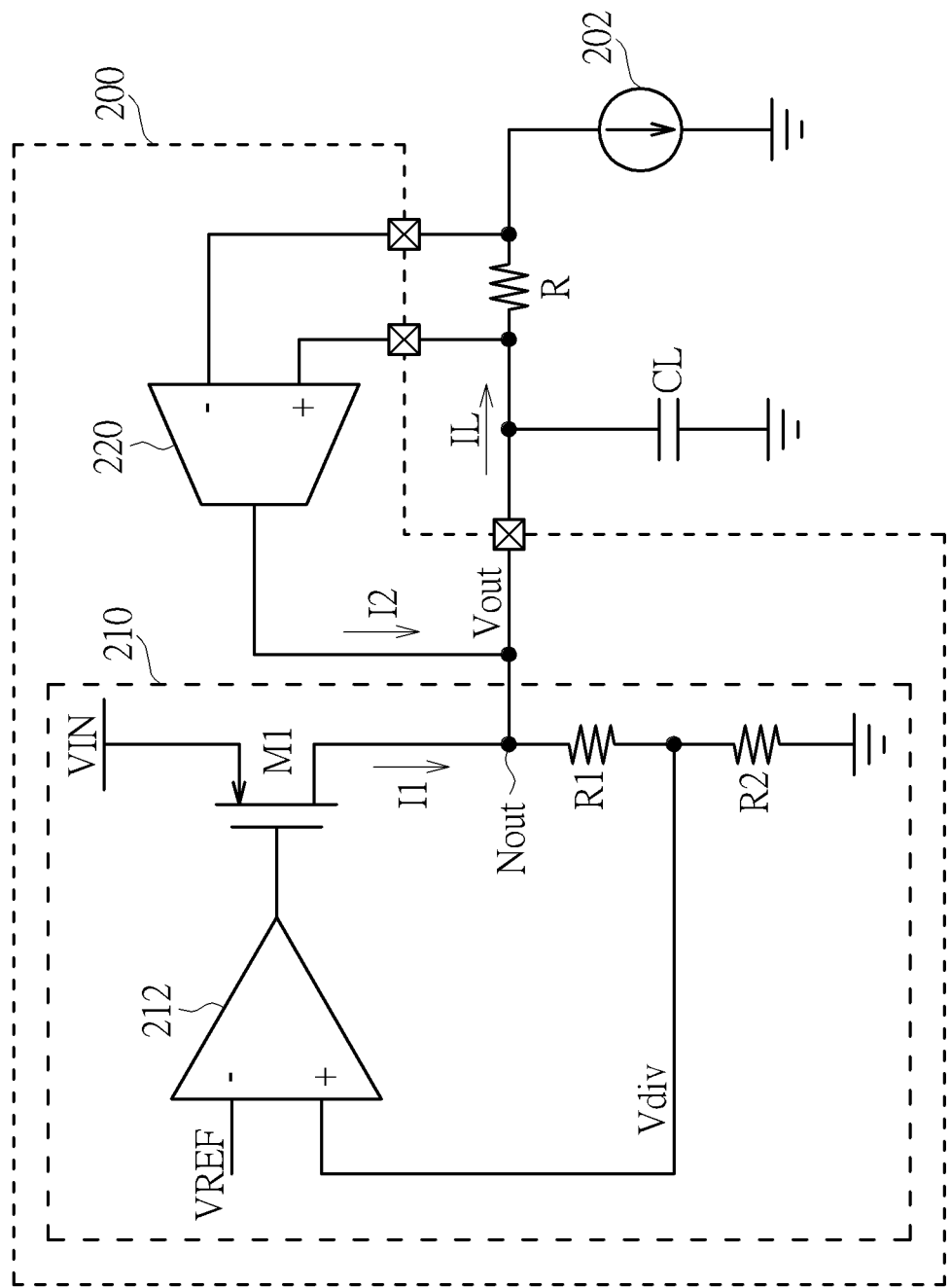
FIG. 2 is a diagram illustrating a voltage regulator according to another embodiment of the present invention.

FIG. 2 is a diagram illustrating a voltage regulator 200 according to one embodiment of the present invention. As shown in FIG. 2, the voltage regulator 200 is within a package, and the voltage regulator 200 is configured to receive an input voltage VIN to provide a stable output voltage Vout to a device 202 via the output capacitor CL and a resistor R, and the device 202 draws an output current IL from the voltage regulator 200. The voltage regulator 200 comprises a voltage control circuit 210 and a current control circuit 220, wherein the voltage control circuit 210 comprises an error amplifier 212, a current generator (a transistor M1 serves as the current generator) and two resistors R1 and R2, and the current control circuit 220 is implemented by a transconductance amplifier. The voltage control circuit 210 is configured to provide a first current I1 to an output terminal Nout of the voltage regulator 200, the current control circuit 220 is configured to provide a second current I2 to the output terminal Nout, and the first current I1 and the second current I2 are combined to serve as the output current IL.

In this embodiment, the voltage control circuit 210 is configured to receive the output voltage Vout to generate the first current I1, so that the output voltage Vout maintains a constant voltage. Specifically, the resistors R1 and R2 serve as a voltage divider to divides the output voltage Vout to generate a divided voltage Vdiv, the error amplifier 212 compares the divided voltage Vdiv with a reference voltage VREF to generate a control signal to control the transistor M1 to provide the first current I1. In addition, the output current IL flows through the resistor R and forms a cross voltage, and the current control circuit 220 receives the voltages at the terminals of the resistor R to generate the second current I2 (i.e., the transconductance amplifier converts a voltage difference between the terminals of the resistor R to generate the second current I2).

In one embodiment, the resistor R may be a parasitic resistor of a routing (e.g. PCB routing). In another embodiment, the resistor R may be intended position for the voltage regulator 200 (i.e., not parasitic resistor).

In the embodiment shown in FIG. 2, by designing the current control circuit 220 to use the output current IL to generate the second current I2, the output voltage Vout can be compensated to make the output voltage Vout return to the desired level in a short time. Therefore, the voltage regulator 200 has fast response when the output voltage Vout is away from the desired level. In addition, each of the voltage control circuit 210 and the current control circuit 220 has its own feedback loop, the second current I2 provided by the current control circuit 220 does not exceed the required output current IL, and the voltage control circuit 210 is configured to provide the first current I1 to supplement the insufficient current, so the loops of the voltage control circuit 210 and the current control circuit 220 do not conflict. Furthermore, because the current control circuit 220 provides a portion of the output current IL, the voltage control circuit 210 with lower transient response does not need to provide large current to the output terminal Nout, and the output capacitor CL can be designed smaller, that is the voltage control circuit 210 has easier loop compensation design and the manufacturing cost can be reduced.

In one embodiment, the second current I2 provided by the current control circuit 220 has a fixed proportional relationship with the output current IL, that is I2=N*IL, wherein N can be any suitable value such as 80% or 90%. In addition, because the IL=I1+I2, the first current I1 provided by the voltage control circuit 210 is also has a fixed proportional relationship with the output current IL, that is I1=M*IL, wherein M+N=100%. In one embodiment, in order to have fast transient response, N is greater than M.

Figure 3:
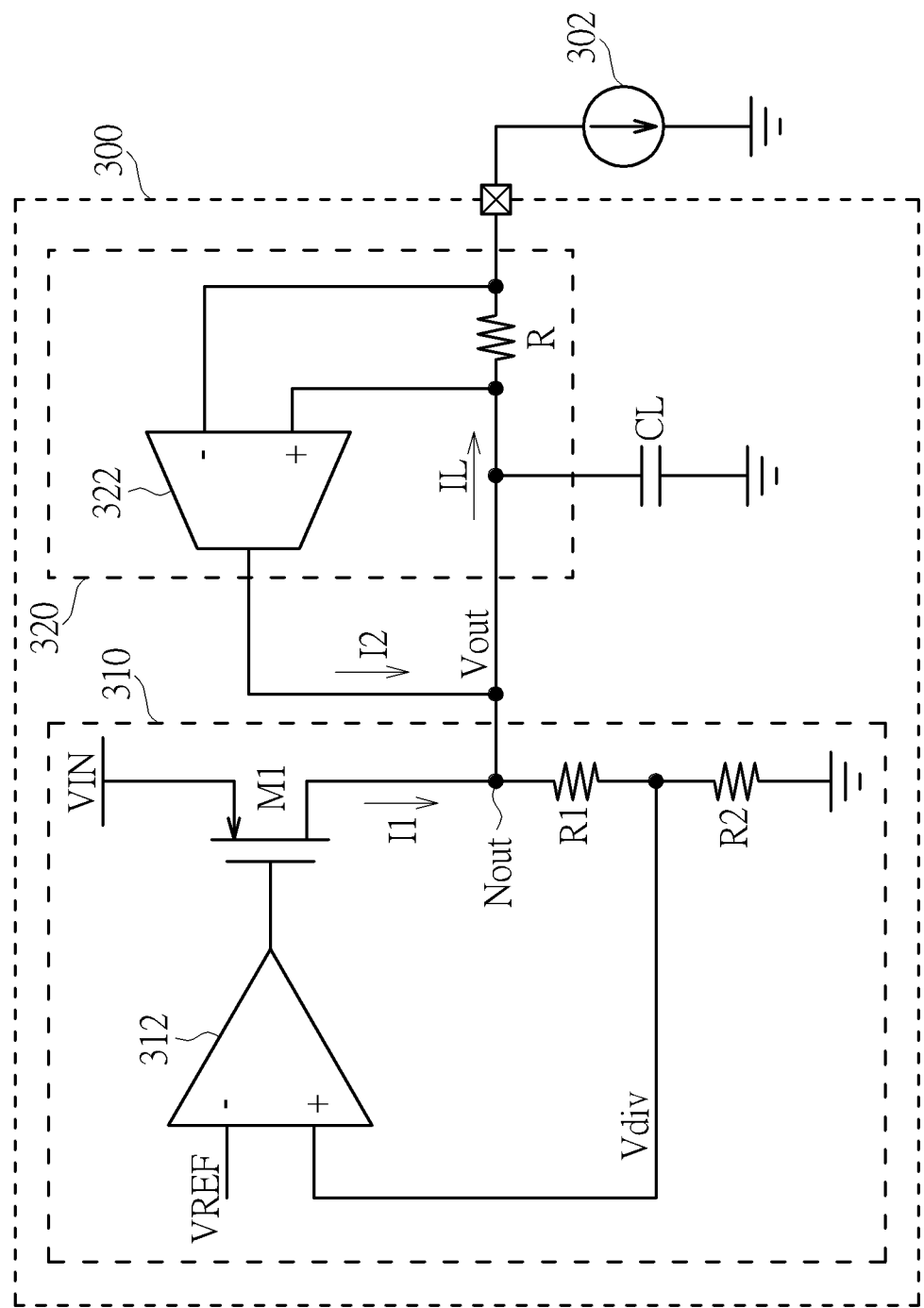
FIG. 3 is a diagram illustrating a voltage regulator according to another embodiment of the present invention.

FIG. 3 is a diagram illustrating a voltage regulator 300 according to one embodiment of the present invention. As shown in FIG. 3, the voltage regulator 300 is within a package, and the voltage regulator 300 is configured to receive an input voltage VIN to provide a stable output voltage Vout to a device 302, and the device 302 draws an output current IL from the voltage regulator 300. The voltage regulator 300 comprises a voltage control circuit 310, a current control circuit 320 and an output capacitor CL, wherein the voltage control circuit 310 comprises an error amplifier 312, a current generator (a transistor M1 serves as the current generator) and two resistors R1 and R2, and the current control circuit 320 comprises a transconductance amplifier 322 and a resistor R. The voltage control circuit 310 is configured to provide a first current I1 to an output terminal Nout of the voltage regulator 300, the current control circuit 320 is configured to provide a second current I2 to the output terminal Nout, and the first current I1 and the second current I2 are combined to serve as the output current IL.

In this embodiment, the voltage control circuit 310 is configured to receive the output voltage Vout to generate the first current I1, so that the output voltage Vout maintains a constant voltage. Specifically, the resistors R1 and R2 serve as a voltage divider to divides the output voltage Vout to generate a divided voltage Vdiv, the error amplifier 312 compares the divided voltage Vdiv with a reference voltage VREF to generate a control signal to control the transistor M1 to provide the first current I1. In addition, the output current IL flows through the resistor R and forms a cross voltage, and the transconductance amplifier 322 converts a voltage difference between the terminals of the resistor R to generate the second current I2.

In one embodiment, the resistor R may be a parasitic resistor of a routing (e.g. PCB routing). In another embodiment, the resistor R may be intended position for the voltage regulator 300 (i.e., not parasitic resistor).

In the embodiment shown in FIG. 3, by designing the current control circuit 320 to use the output current IL to generate the second current I2, the output voltage Vout can be compensated to make the output voltage Vout return to the desired level in a short time. Therefore, the voltage regulator 300 has fast response when the output voltage Vout is away from the desired level. In addition, each of the voltage control circuit 310 and the current control circuit 320 has its own feedback loop, the second current I2 provided by the current control circuit 320 does not exceed the required output current IL, and the voltage control circuit 310 is configured to provide the first current I1 to supplement the insufficient current, so the loops of the voltage control circuit 310 and the current control circuit 320 do not conflict. Furthermore, because the current control circuit 320 provides a portion of the output current IL, the voltage control circuit 310 with lower transient response does not need to provide large current to the output terminal Nout, therefore the voltage control circuit 310 has easier loop compensation design. In addition, because the output capacitor CL can be designed smaller due to the design of the current control circuit 320, the output capacitor CL can be designed within the package without being positioned on a printed circuit board, therefore the manufacturing cost can be reduced.

In one embodiment, the second current I2 provided by the current control circuit 320 has a fixed proportional relationship with the output current IL, that is I2=N*IL, wherein N can be any suitable value such as 80% or 90%. In addition, because the IL=I1+I2, the first current I1 provided by the voltage control circuit 310 is also has a fixed proportional relationship with the output current IL, that is I1=M*IL, wherein M+N=100%. In one embodiment, in order to have fast transient response, N is greater than M.

In another embodiment of the present invention, a buffer can be positioned at an output terminal of the current control circuit 220 shown in FIG. 2 or the transconductance amplifier 322 shown in FIG. 3.

Figure 4:
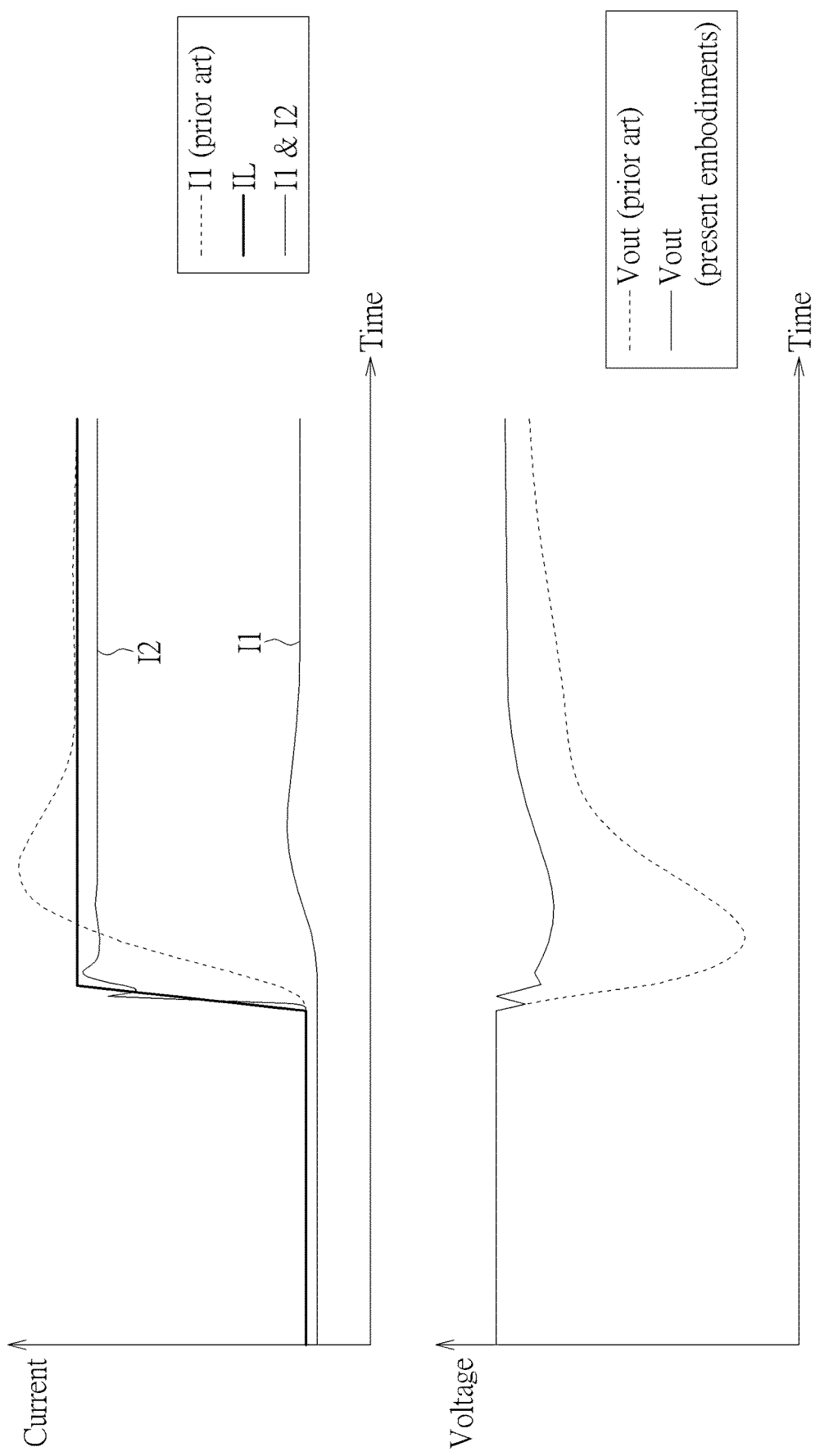
FIG. 4 is a simulation result of the voltage regulator according to one embodiment of the present invention.

FIG. 4 is a simulation result of the voltage regulator 100/200/300 according to one embodiment of the present invention. As shown in FIG. 4, when the device 102/202/302 suddenly draws a large amount of current, that is the output current IL increases rapidly, the current control circuit 120/220/320 can immediately provide the second current I2 to compensate the output voltage Vout, so that the output voltage Vout returns to the desired level in a short time. FIG. 4 also shows the conventional voltage regulator that does not include the current control circuit 120/220/320. Compared with the conventional voltage regulator, the embodiments shown in FIGS. 1-3 do have a faster response time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage regulator, comprising:
a voltage control circuit, configured to receive an output voltage of the voltage regulator to generate a first current to an output terminal of the voltage regulator; and
a current control circuit, configured to generate a second current to the output terminal of the voltage regulator according to an output current of the voltage regulator, wherein the output current is generated according to a combination of the first current and the second current.

2. The voltage regulator of claim 1, wherein the second current has a fixed ratio to the output current.

3. The voltage regulator of claim 2, wherein the second current is equal to N times the output current, and the first current is equal to M times the output current.

4. The voltage regulator of claim 3, wherein a summation of M and N is equal to 100%.

5. The voltage regulator of claim 3, wherein N is greater than M.

6. The voltage regulator of claim 1, wherein a loop of the voltage control circuit and a loop of the current control circuit are independent of each other.

7. The voltage regulator of claim 6, wherein the voltage control circuit comprises:
an error amplifier, configured to compare a signal derived from the output voltage with a reference voltage to generate a control signal; and
a current generator, configured to generate the first current according to the control signal.

8. The voltage regulator of claim 6, wherein the current control circuit comprises a transconductance amplifier configured to receive a voltage signal generated according to the output current to generate the second current.

9. The voltage regulator of claim 6, wherein the current control circuit comprises:
a resistor, coupled to the output terminal of the voltage regulator, wherein the output current flows through the resistor; and
a transconductance amplifier, configured to receive voltage signals at two terminals of the resistor to generate the second current.

10. The voltage regulator of claim 9, further comprising:
an output capacitor, coupled between the output terminal of the voltage regulator and a reference voltage;
wherein the output capacitor and the voltage regulator are within a single package.

* * * * *